United States Patent
Wei et al.

(10) Patent No.: US 10,651,069 B2
(45) Date of Patent: *May 12, 2020

(54) APPARATUS FOR FLIPPING SEMICONDUCTOR DEVICE

(71) Applicant: EPISTAR CORPORATION, Hsinchu (TW)

(72) Inventors: Chih-Wei Wei, Hsinchu (TW); Chia-Liang Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 290 days.

This patent is subject to a terminal disclaimer.

(21) Appl. No.: 15/666,075

(22) Filed: Aug. 1, 2017

(65) Prior Publication Data

US 2017/0330781 A1 Nov. 16, 2017

Related U.S. Application Data

(63) Continuation of application No. 14/960,819, filed on Dec. 7, 2015, now Pat. No. 9,754,808, which is a continuation of application No. 14/150,439, filed on Jan. 8, 2014, now Pat. No. 9,209,058.

(51) Int. Cl.
| | | |
|---|---|---|
| *H01L 21/68* | (2006.01) | |
| *H01L 21/67* | (2006.01) | |
| *B21D 37/14* | (2006.01) | |
| *B29C 48/154* | (2019.01) | |
| *B29C 35/10* | (2006.01) | |
| *B29C 48/06* | (2019.01) | |
| *B29C 48/19* | (2019.01) | |
| *B29C 48/91* | (2019.01) | |
| *B29C 48/88* | (2019.01) | |
| *B29C 35/08* | (2006.01) | |

(52) U.S. Cl.
CPC .............. *H01L 21/68* (2013.01); *B21D 37/14* (2013.01); *B29C 48/154* (2019.02); *H01L 21/67109* (2013.01); *B29C 35/10* (2013.01); *B29C 48/06* (2019.02); *B29C 48/19* (2019.02); *B29C 48/91* (2019.02); *B29C 48/9135* (2019.02); *B29C 2035/0811* (2013.01)

(58) Field of Classification Search
CPC ... B21D 37/14; H01L 21/67109; H01L 21/68; B29C 2035/0811; B29C 35/10; B29C 48/06; B29C 48/154; B29C 48/19; B29C 48/91; B29C 48/9135; H01B 13/14
USPC ........... 29/832; 414/758, 816; 156/449, 538, 156/580
See application file for complete search history.

(56) References Cited

U.S. PATENT DOCUMENTS 5,705,016 A * 1/1998 Senoo .................. B28D 5/0082
156/289

* cited by examiner

*Primary Examiner* — Sonya M Sengupta
(74) *Attorney, Agent, or Firm* — Ditthavong & Steiner, P.C.

(57) ABSTRACT

An apparatus for transferring a semiconductor device comprises platform comprising a carrier; a positioning unit above the platform and comprising an opening; and an elevating unit connecting the platform and the positioning unit; and a heater.

20 Claims, 3 Drawing Sheets

APPARATUS FOR FLIPPING SEMICONDUCTOR DEVICE

REFERENCE TO RELATED APPLICATION

This application a continuation application of U.S. patent application Ser. No. 14/960,819, filed Dec. 7, 2015, now pending, which is a continuation application of U.S. patent application Ser. No. 14/150,439, filed Jan. 8, 2014, now U.S. Pat. No. 9,209,058, the content of which is hereby incorporated by reference in its entirety.

TECHNICAL FIELD

The present application relates to a method for flipping multiple semiconductor devices in wafer form or in chip form.

DESCRIPTION OF BACKGROUND ART

In order to fit in the process of producing a semiconductor device or adjust by the limitation of the apparatus, the semiconductor device needs to be flipped so as to reverse the top surface and the bottom surface of the semiconductor device. Presently the flipping step is carried out manually. As a result, the flipping step requires human effort and is time-consuming, and furthermore, the semiconductor device during the flipping step is prone to damage.

SUMMARY OF THE DISCLOSURE

An apparatus for transferring a semiconductor device comprises platform comprising a carrier; a positioning unit above the platform and comprising an opening; and an elevating unit connecting the platform and the positioning unit; and a heater.

DETAILED DESCRIPTION OF PREFERRED EMBODIMENTS

Figure 1:
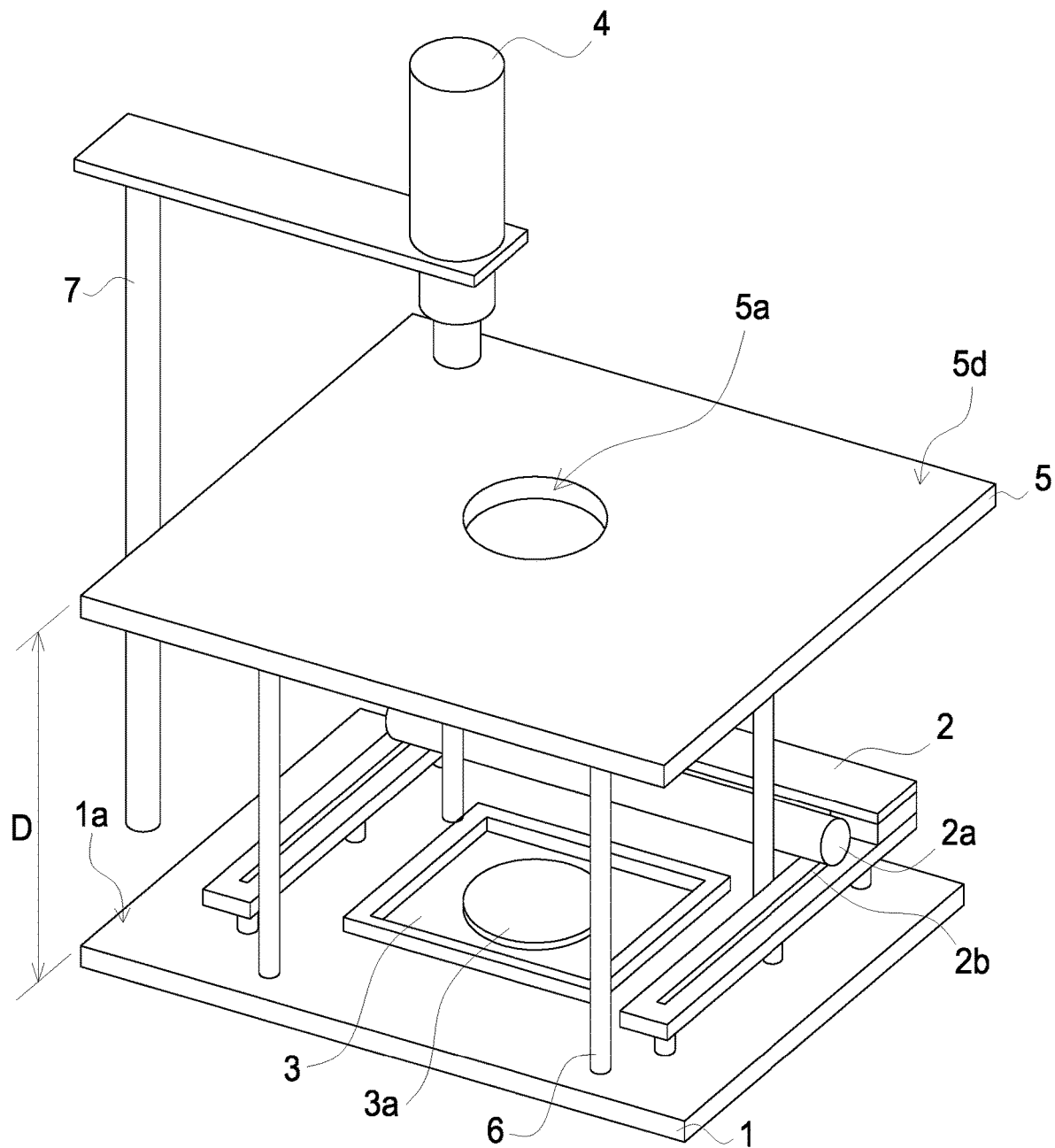
FIG. 1 is a diagram of the apparatus for flipping a semiconductor device in accordance with the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

FIG. 1 is a diagram of the apparatus for flipping a semiconductor device in accordance with an embodiment of the present application. The apparatus for flipping a semiconductor device comprises: a platform 1 comprising an upper surface 1a, a roller system 2 and a carrier 3 on the upper surface 1a; a positioning unit 5 comprising an upper surface 5d above the platform 1 and comprising a circular opening 5a; and an elevating unit 6 connecting the platform 1 and the positioning unit 5.

In the present embodiment, the roller system 2 comprises a roller 2a and a track 2b, wherein the roller 2a moves along the track 2b. The roller 2a comprises non rigid body or elastic material, such as rubber. More preferably, the roller 2a is composed of rubber. The roller 2a can roll and exert a downward pressure on an object. The roller 2a can roll with a constant speed, variable speed, or a constant acceleration. Besides, the shape of the roller 2a can be a cylinder or a barrel-shaped cylinder with two extending cylinder ends. Specifically, the barrel-shaped cylinder is defined as a cylinder having a lager thickness in the middle portion than the other portion. The carrier 3 comprises a heating unit (not shown). The apparatus for flipping a semiconductor device further comprises a fixture 3a on the carrier 3. Besides, an adhesive substance (not shown) is adhered to the fixture 3a, wherein the stickiness of the adhesive substance changes with the change of temperature. In the present embodiment, the adhesive substance can be a foam sealing agent.

The positioning unit 5 is above the platform 1 and comprises the circular opening 5a. Furthermore, a movable heater 4 is fixed on a pillar 7. The pillar 7 can move along the vertical direction so as to change the position of the movable heater 4 above the positioning unit 5. The elevating unit 6 is between the platform 1 and the positioning unit 5 and connects the platform 1 and the positioning unit 5. The elevating unit 6 further comprises a pneumatic cylinder (not shown) for providing driving force. In the present embodiment, the elevating unit 6 comprises 4 adjustable uniaxial cylinders. The elevating unit 6 moves along the vertical direction so as to move the positioning unit 5 toward or away from the platform 1.

The apparatus for flipping a semiconductor device in accordance with the present application is capable of flipping a semiconductor device so as to reverse a top surface and a bottom surface of the semiconductor device, wherein the semiconductor device is in wafer form or in chip form, such as light-emitting diode wafer or light-emitting diode chip. In the present embodiment, the semiconductor device comprises multiple light-emitting diode chips 8. The steps of the operation method of the apparatus for flipping a semiconductor device are described as follows.

Figure 2A:
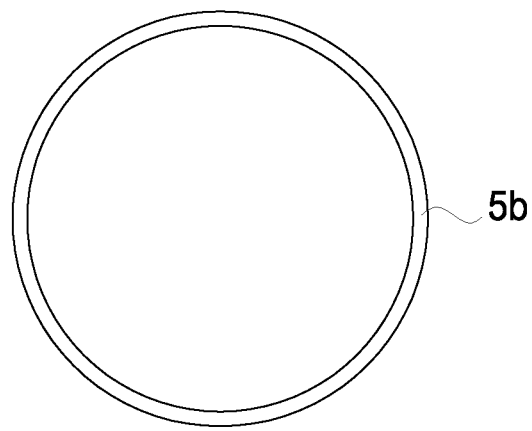
FIGS. 2a to 2c schematically show a semiconductor device fixed on an adhesive substance in accordance with an embodiment of the present application.
Figure 2B:
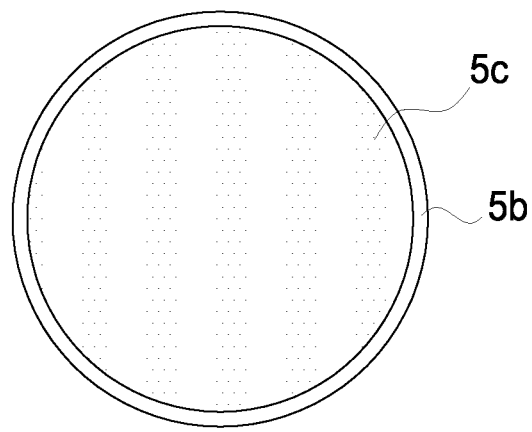
Figure 2C:
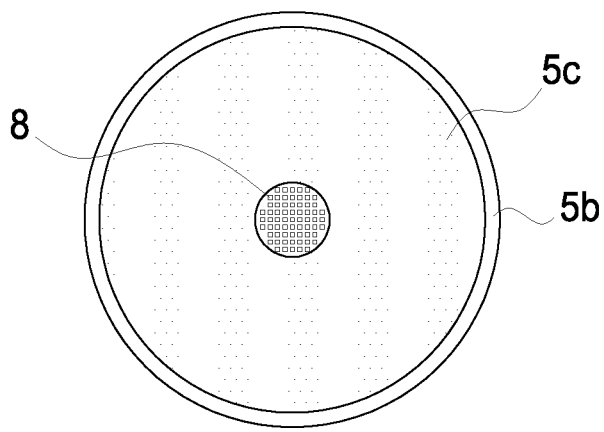

1. The light-emitting diode chips 8 are fixed on an adhesive substance 5c attached to an iron ring 5b as shown in FIGS. 2a to 2c. Specifically, referring to FIG. 2a, an iron ring 5b is provided. Referring to FIG. 2b, an adhesive substance 5c is applied to associate with the iron ring 5b. In the present embodiment, the adhesive substance 5c can be an adhesive film. Referring to FIG. 2C, the light-emitting diode chips 8 are fixed to the iron ring 5b by directly connecting each bottom surface of the light-emitting diode chips 8 to the adhesive substance 5c, wherein each top surface of the light-emitting diode chips 8 faces upwardly. In the present embodiment, the stickiness of the adhesive substance 5c changes with the change of the temperature, and the change of the stickiness does not contaminate and affect the light-emitting diode chips 8.

2. The iron ring 5b is fixed to the positioning unit 5. Specifically, the iron ring 5b attached to the adhesive substance 5c is fixed at the circular opening 5a and each top surface of the light-emitting diode chips 8 faces downwardly while the positioning unit 5 is at a position where a distance between the upper surface 5d of the positioning unit 5 and the upper surface 1a of the platform 1 is D, wherein the position is defined as starting position.

Figure 3:
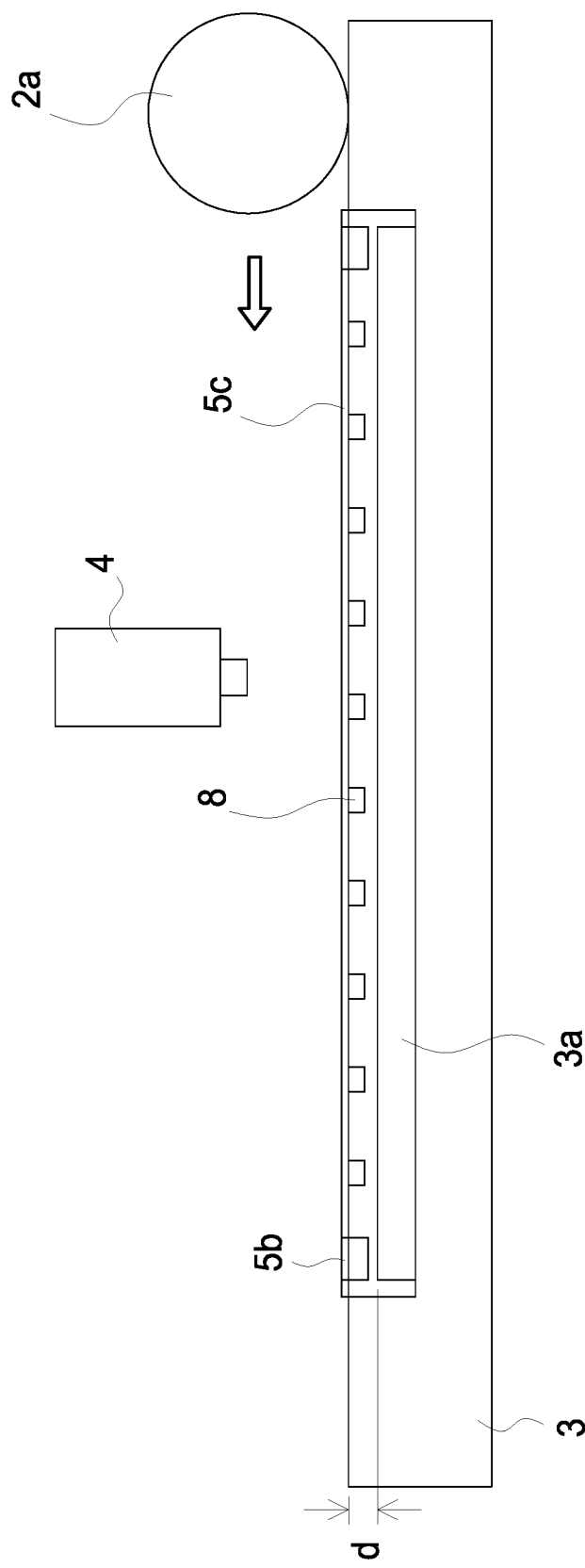
FIG. 3 schematically shows a step of flipping the semiconductor device in accordance with an embodiment of the present application.

3. The positioning unit 5 is set to a predetermined position. Specifically, referring to FIG. 3, a substrate (not shown) is disposed on the fixture 3a, wherein the substrate comprises $Al_2O_3$. Besides, an adhesive substance (not shown) such as a foam sealing agent is adhered to the substrate. The heating unit of the carrier 3 is then turned on to heat the adhesive substance so as to enhance the stickiness of the adhesive substance. The relative position and the distance between the circular opening 5a and the fixture 3a of the carrier 3 are adjusted by moving the elevating unit 6 so as to facilitate the following flipping step. In the present embodiment, the distance d between the iron ring 5b and the fixture 3a is not more than 0.2 cm.

4. The light-emitting diode chips 8 are flipped. Specifically, referring to FIG. 3, after the positioning unit 5 being completely set to the predetermined position, the roller 2a rolls and exerts a downward pressure while moving along the track 2d as shown in FIG. 1. In the present embodiment, the roller 2a rolls on the surface of the adhesive substance 5c attached to the iron ring 5b back and forth at least one time. In general, the movement of the rolling and exerting a downward pressure of the roller 2a can be carried out by a programmable logic controller (PLC) (not shown). The pillar 7 then moves downwardly to change the position and the distance of the movable heater 4 above the adhesive substance 5c attached to the iron ring 5b. The movable heater 4 is then turned on to heat the adhesive substance 5c so as to change the stickiness of the adhesive substance 5c with the change of the temperature. As a result, the light-emitting diode chips 8 that were originally adhered to the adhesive substance 5c are now transferred to the adhesive substance of the substrate of the fixture 3a. Finally, the top surface and the bottom surface of each light-emitting diode chip are reversed.

5. The positioning unit returns to the starting position.

6. The light-emitting diode chips 8 are taken out from the adhesive substance of the substrate of the fixture 3a.

7. In the present embodiment in accordance with the present application, the semiconductor device comprises multiple light-emitting diode chips 8, wherein each light-emitting diode chip 8 comprises AlGaInP-based material, AlGaInN-based material or ZnO-based material.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. An apparatus for transferring a semiconductor device, comprising:
   a platform comprising a carrier;
   a positioning unit arranged above the platform and comprising an opening; and
   an elevating unit connecting the platform and the positioning unit; and
   a heater arranged above the positioning unit.

2. The apparatus for transferring a semiconductor device according to claim 1, further comprising a roller system, wherein the roller system comprises a roller and a track, the roller is configured to move along the track.

3. The apparatus for transferring a semiconductor device according to claim 2, wherein the roller comprises a non rigid body or an elastic material.

4. The apparatus for transferring a semiconductor device according to claim 2, wherein the roller has a shape of a cylinder or a barrel-shaped cylinder with two extending cylinder ends.

5. The apparatus for transferring a semiconductor device according to claim 2, wherein the roller is configured to roll at a constant speed, variable speed, or a constant acceleration.

6. The apparatus for transferring a semiconductor device according to claim 2, wherein the roller is capable of rolling and exerting a downward pressure.

7. The apparatus for transferring a semiconductor device according to claim 1, further comprising a ring fixed at the opening.

8. The apparatus for transferring a semiconductor device according to claim 7, further comprising an adhesive substance attached to the ring.

9. The apparatus for transferring a semiconductor device according to claim 8, wherein a stickiness of the adhesive substance changes with a change of temperature.

10. The apparatus for transferring a semiconductor device according to claim 1, further comprising a fixture on the carrier.

11. The apparatus for transferring a semiconductor device according to claim 10, further comprising an adhesive substance attached to the fixture.

12. The apparatus for transferring a semiconductor device according to claim 11, wherein a stickiness of the adhesive substance changes with a change of temperature.

13. The apparatus for transferring a semiconductor device according to claim 1, wherein the elevating unit comprises a pneumatic cylinder for providing driving force.

14. The apparatus for transferring a semiconductor device according to claim 13, wherein the pneumatic cylinder is an adjustable uniaxial cylinder.

15. The apparatus for transferring a semiconductor device according to claim 1, wherein the heater is movable above the positioning unit.

16. The apparatus for transferring a semiconductor device according to claim 2, wherein the roller comprises a rubber.

17. The apparatus for transferring a semiconductor device according to claim 1, wherein the positioning unit is configured to move toward or away from the platform.

18. The apparatus for transferring a semiconductor device according to claim 1, wherein the carrier comprises a heating unit.

19. The apparatus for transferring a semiconductor device according to claim 1, wherein the opening is circular.

20. The apparatus for transferring a semiconductor device according to claim 1, wherein the heater is arranged to change its position relative to the positioning unit.

* * * * *